(12) United States Patent
Meldrum et al.

(10) Patent No.: US 8,450,127 B2
(45) Date of Patent: May 28, 2013

(54) LIGHT EMITTING SEMICONDUCTOR DIODE

(75) Inventors: Al Meldrum, Edmonton, CA (US); Sulan Kuai, Edmonton, CA (US)

(73) Assignee: The Governors of the University of Alberta, Edmonton (CA)

( * ) Notice: Subject to any disclaimer, the term of this patent is extended or adjusted under 35 U.S.C. 154(b) by 579 days.

(21) Appl. No.: 12/677,296

(22) PCT Filed: Sep. 10, 2008

(86) PCT No.: PCT/CA2008/001587
§ 371 (c)(1),
(2), (4) Date: Mar. 9, 2010

(87) PCT Pub. No.: WO2009/033266
PCT Pub. Date: Mar. 19, 2009

(65) Prior Publication Data
US 2010/0207549 A1      Aug. 19, 2010

Related U.S. Application Data

(60) Provisional application No. 60/971,136, filed on Sep. 10, 2007.

(51) Int. Cl.
*H01L 21/00* (2006.01)
*H01L 33/00* (2010.01)
(52) U.S. Cl.
USPC .............................................. 438/24; 257/86
(58) Field of Classification Search
USPC ....................... 438/22–29, 65–72; 257/86, 98, E33.056–E33.059
See application file for complete search history.

(56) References Cited

U.S. PATENT DOCUMENTS

| | | | |
|---|---|---|---|
| 5,458,735 A | 10/1995 | Richter et al. | |
| 5,552,328 A | 9/1996 | Orlowski et al. | |
| 5,627,396 A | 5/1997 | James et al. | |
| 5,810,994 A | 9/1998 | Lee et al. | |
| 5,952,680 A | 9/1999 | Strite | |
| 8,097,868 B2 * | 1/2012 | Monaco et al. | ............... 250/551 |
| 2005/0017257 A1 | 1/2005 | Green et al. | |

OTHER PUBLICATIONS

Castagna et al., "Si-based erbium-doped light-emitting devices", Journal of Luminescence, (2006), 121, pp. 187-192.*
Castagna M.E. et al., "Si-based erbium-doped light-emitting devices", Journal of Luminescence, (2006), 121, pp. 187-192.
sNg, W.L. et al., "An efficient room-temperature silicon-based light-emitting diode", Nature, (2001), 410, pp. 192-194.

(Continued)

*Primary Examiner* — Calvin Lee
(74) *Attorney, Agent, or Firm* — Christensen O'Connor Johnson Kindness PLLC

(57) ABSTRACT

Visible and infrared light sources on silicon that have several attractive properties with respect to integrated optics. First, the devices are operational at room temperature and strictly require no thermal processing in their synthesis (although low temperature annealing can be used to form Ohmic contacts). These devices could therefore be included at any stage of chip fabrication. The special ease of synthesis of these silicon LEDs enables simple fabrication of surface structures such as patterned emitters and photonic crystal surfaces that enhance light emission in the forward direction. The LEDs are color-switchable—by reversing the current one can switch from infrared emission to visible emission. The lifetime of the luminescence is much shorter than the standard carrier recombination time in silicon, suggesting direct modulation of the emitted light.

7 Claims, 8 Drawing Sheets

OTHER PUBLICATIONS

Green, M.A. et al., "Efficient silicon light-emitting diodes", Nature, (2001), 412, pp. 805-808.

Stowe, D.J. et al., "Near-band gap luminsecence at room temperature form dislocations in silicon", Physica B, (2003), 340-342, pp. 710-713.

Hoang, T. et al., "Strong Efficiency Improvement of SOI-LEDs Through Carrier Confienment", IEEE Electron Device Letters, (2007), 28(5), pp. 383-385.

du Plessis, M. et al., "Spatial and Intensity Modulation of Light Emission From a Silicon LED Matrix", IEEE Photonics Technology Letters, (2002), 14(6), pp. 768-770.

Liang, E-Z. et al., "Rigorous carrier dynamic model of electroluminescent metal-oxide-semiconductor silicon tunneling diodes", Journal of Applied Physics, (2006), 100(054509), pp. 1-9.

Trupke, T. et al., "Very efficient light emission from bulk crystalline silicon", Applied Physics Letters, (2003), pp. 2996-2998.

Prucnal, S. et al., "Switchable two-color electroluminescence based on a Si metal-oxide-semiconductor structure doped with Eu", Applied Physics Letters, (2007), 90(181121), pp. 1-3.

Presti, C.D. et al., "Photonic-crystal silicon-nanocluster light-emitting device", Applied Physics Letters, (2006), 88 (033501), pp. 1-3.

Paniccia, M. et al., "The Silicon Solution", IEEE Spectrum, (Oct. 2005), pp. 38-43.

Sedky, S. et al., "Experimental Determination of the Maximum Post-Process Annealing Temperature for Standard CMOS Wafers", (2001), 48(2), pp. 377-385.

Sakurai, T., "Perspectives on Power-Aware Electronics", IEEE/ISSCC Digest of Technical Papers, (2003), pp. 26-29.

Reed, G.T. "The optical age of silicon", Nature, (2004), 427, pp. 595-596.

Liu, A. et al., "A high-speed silicon optical modulator based on a metal-oxide-semiconductor capactior", Nature, (2004), 427, pp. 615-618.

Green, W.M.J. et al., "Ultra-compact low RF power, 10 Gb/s silicon Mach-Zehnder modulator", Optics Express, (2007) 15, pp. 17106-17113.

Suzuki M. et al., "Transient Response in Monolithic Mach-Zehnder Optical Modulator . . . etc.", Journal of Applied Physics (2007) 46, pp. 2462-2466.

Castagna M.E. et al., "High efficiency light emitting devices in silicon", Materials Science and Engineering B, (2003), 105, pp. 83-90.

Carreras, J. et al., "Direct modulation of electroluminescence from silicon nanocrystals . . . etc.", Applied Physics Letters, (2008), 92(091103), pp. 1-3.

Emel'yanov, A.M. et al., "Kinetics of Electroluminescence in an Efficient Silicon Light-Emitting Diode . . . etc.", Physics of Semiconductor Devices, (2004), 38(5), pp. 634-638.

Chen, M-J. et al., "Carrier lifetime measurement on electroluminsecent metal-oxide-silicon tunneling diodes", Applied Physics Letters, (2001), 79(14), pp. 2264-2266.

Dittrich, T. et al., "Room temperature electroluminsecence from a c-Si p-i-n structure", Journal of Applied Physics, (2001), 90(5), pp. 2310-2313.

Snyman, L.W. et al., "Characterization of breakdown phenomoena in light emitting silicton n+ p diodes", Journal of Applied Physics, (1998), 84(5), pp. 2953-2959.

Chatterjee, A. et al., "High-Speed Light Modulation in Avalanche Breakdown Mode for Si Diodes", IEEE Electron Device Letters, (2004), 25(9), pp. 628-630.

Fiory, A.T. et al., Light Emission from Silicon: Some Perspectives and Applications, Electronic Materials, (2003), 32 (10), pp. 1043-1051.

Rong, H. et al., "A continuous-wave Raman silicon", Nature (3005), 433, pp. 725-728, (2005).

Liu, J. et al., "Tensile-strained, n-type Ge as a gain medium for monolithic laser integration on Si.", Optics Express, 15 (18), pp. 11272-11277, (2002).

Mi, Z. et al., "High speed 1.3 µm tunnel injection quantum-dot lasers", Applied Physics Letters, (2005), 86(153109), pp. 1-3.

Lin, C-F. et al., "Electroluminescence at Si band gap energy based on metal-oxide-silicon structures", Journal of Applied Sciences, (2000), 87(12), pp. 8793-8795.

Qin, G.G. et al., "Electroluminescence from Au/Native Oxide/P-Si . . . etc.", Solid State Communcations, (1995), 94(8), pp. 607-612.

Wolkenberg, A., "A mechanism for the effect of doping on the silicon native oxide thickness", Physica Status Solidi, (1983), 79, pp. 313-322.

Carreras, J. et al., "Auger quenching-based modulation of electroluminescence from ion-implanted silicon nanocrystals", Nanotechnology, (2008), 19, pp. 1-9.

"ITRS Home", International Technology Roadmap for Semiconductors [online], www.itrs.net, (2012).

* cited by examiner

LIGHT EMITTING SEMICONDUCTOR DIODE

TECHNICAL FIELD

Light emitting diodes.

BACKGROUND

The main motivation for this work is the need for a light source on silicon that is compatible with standard microelectronics processing. This need is driven by the limitations currently faced by the microelectronics industry due to the minimum physical sizes for copper interconnects—the main signal transmission system used on computer chips. As these interconnects are made smaller (currently down to a few tens of nm across) several unwanted problems arise, including RC time delay, heating or power dissipation, and electromagnetic interference (crosstalk). Currently, interconnects constitute about 70% of on-chip capacitance and approximately 1,200 m in total length per square cm of chip size. Unfortunately, as the number of transistors on a chip grows, so does the requirement for more interconnects, which also presents problems in terms of how to physically "pack in" all the required structures.

One hope to overcome the interconnect problem is to replace at least some of the electronic interconnects with optical ones. This would offer many advantages: light requires no physical transmission lines (although in some circumstances optical waveguides are expected to be required), optical signals generate no heat, no RC time delays, and light signals can "cross through" one another. However, despite these technical advantages, suitable light systems have not yet been found. The appropriate devices must include the three principal components of an optical communications system: the light source, the waveguide, and the detector. Our work is driven by the desire for a suitable light source.

A light source on silicon must meet several requirements to be used in integrated optics. First, it must be chemically compatible with silicon. That is, the materials comprising the light source must not adversely affect the rest of the chip. This has been a problem for III-V diodes made of materials such as GaAs. The reverse requirement is also true: it must be possible to grow the diode on a silicon wafer, which can lead to bonding or surface epitaxy problems. For these and other reasons, silicon itself may offer potential for a silicon-based LED, which would obviously circumvent the problems described above.

Traditionally silicon has proved to be a highly inefficient light emitter due to the indirect nature of the bandgap. This fact also means that the carrier lifetimes in silicon are long, which is undesired in optical communications in which the signals should be modulated rapidly. In recent years, however, there has been much development toward light-emitting silicon. Quantum confined silicon structures (e.g., porous silicon, or silicon nanocrystals) can emit light more efficiently than normal bulk silicon, with wavelengths typically in the visible part of the spectrum. Erbium-doped silicon and silicon nanostructures can act as light emitters in the 1.5 micron fiber transparency window, and LEDs have been demonstrated from these materials (M. Castagna, A. Muscara, S. Leonardi, S. Coffa, L. Caristia, C. Tringali and S. Lorenti, J. Lumin., 121, 187 (2006)). However, nanocrystals suffer from efficiency and conduction problems due to the oxide matrix in which they are embedded, porous silicon can be problematic for similar reasons and because of its fragility, the switching times are long, and erbium-doped silicon structures, although promising, have not yet proven sufficient for integration (due partly to low room-temperature intensities in the case of bulk silicon) and additional problems in the case of oxide films in which nanocrystals are used to sensitize the erbium fluorescence.

One promising materials system is bulk silicon itself. In the past 5-6 years, there have been several studies which have shown reasonably bright band-edge emission from silicon wafers (W. L. Ng, M. A. Lourenco, R. M. Gwilliam, S. Ledain, G. Shao, and K. P. Homewood, Nature 410, 192 (2001), M. A. Green, J. Zhao, A. Wang, P. J. Reese, and M. Gal, Nature 412, 805 (2001)). Much of this work has focused on p-n junctions, in which one of several methods can be employed to reduce the nonradiative recombination that has traditionally plagued bulk silicon. These methods generally involve some form of carrier confinement that prevents electrons and holes from sampling a large volume of the specimen where they might find nonradiative recombination pathways. Such confinement methods can involve the use of strain fields (D. J. Stowe, S. A. Galloway, S. Senkader, K. Mallik, R. J. Falster, and P. R. Wilshaw, Physica B 340-342, 710 (2003)), the concentration of electric fields at surface protuberances in the specimen (J. F. Harvey, R. A. Lux, and R. Tsu, Silicon nanostructure light-emitting diode. U.S. Pat. No. 5,627,386), or other physical methods in which the emitting region is made as small as possible (T. Hoang, P. LeMinh, J. Holleman, and J. Schmitz, IEEE Electron Device Letters, 28, 383 (2007) M. du Plessis, H. Aharoni, and L. W. Snyman, IEEE Photonics Tech. Lett. 14, 768 (2002)). In the case of tunnel diodes the carrier confinement arises as a result of band bending in a metal-oxide-semiconductor (MOS) device operated in accumulation mode (E.-Z. Liang, T.-W. Su, and C.-F. Lin, J. Appl. Phys. 100, 054509 (2006)).

SUMMARY

In an embodiment, there is provided a light emitting diode made with a semiconductor wafer. The semiconductor in one embodiment may have an indirect bandgap such as is the case with silicon. A surface layer on the semiconductor wafer is sufficiently electrically insulating to allow quantum tunneling of charge carriers through the surface layer and has a thickness of 3 nm or less. A conductive layer on the surface layer is electrically conductive and at least sufficiently transparent to allow electromagnetic radiation to pass through the conductive layer. Contacts on or forming part of the semiconductor wafer and conductive layer connect to a power source. In this tunnel diode, carrier confinement arises as a result of band bending in a metal-oxide-semiconductor (MOS) device. When silicon is used for the wafer, the device may be made with CMOS post-processing-compatible fabrication temperatures. By selection of the Fermi levels of the conductive layer and the wafer, the device provides wavelength switchability.

These and other aspects of the device and method are set out in the claims, which are incorporated here by reference.

BRIEF DESCRIPTION OF THE FIGURES

Embodiments will now be described with reference to the figures, in which like reference characters denote like elements, by way of example, and in which.

DETAILED DESCRIPTION

Figure 1:
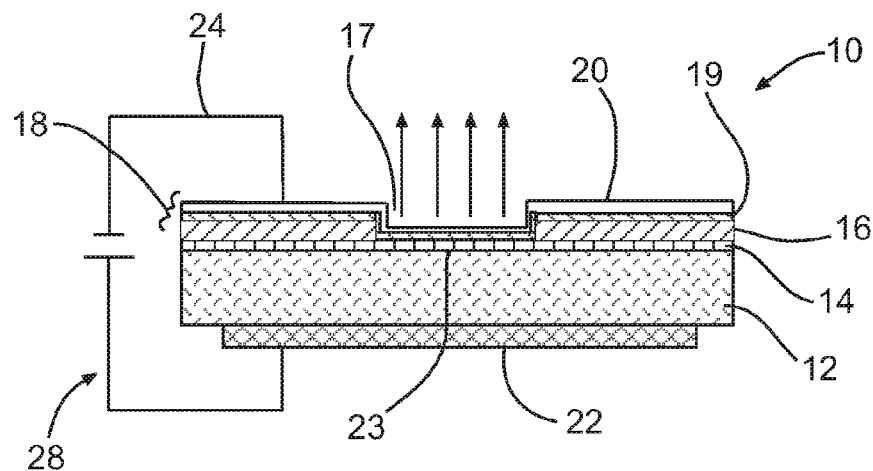
FIG. 1 is a cross sectional view of an LED using a p-type Si wafer with an Au front contact and an Al back contact.

Light in this document refers to electromagnetic radiation of any wavelength. Referring to FIG. 1 an embodiment of a light emitting diode 10 is made from a semiconductor wafer 12, which may for example be a semiconductor having an indirect bandgap. The example shown here uses bulk silicon p-doped to a resistivity of <0.02 Ω-cm but is otherwise untreated and in a natural state. A surface layer 14 is provided on the semiconductor wafer 12. The surface layer 14 is sufficiently electrically insulating to allow quantum tunneling of charge carriers through the surface layer and has a thickness of 3 nm or less, for example 1-3 nm. Native oxide on the surface of the wafer 12 may be used as the surface layer 14. If desired, other insulators may be used, such as an oxide layer added by any of a variety of methods, but it is not necessary for basic operation.

Figure 1A:
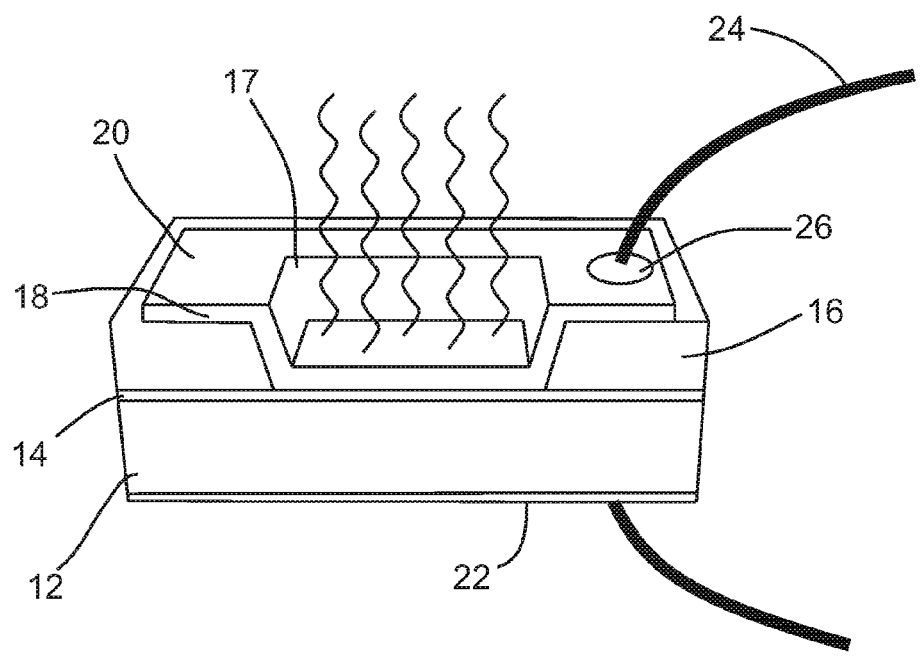
FIG. 1A is a perspective view of the embodiment of FIG. 1.

To produce light generating patterns on the face of the wafer 12, a buffer layer 16 that is sufficiently thick to block current flow is deposited on top of the surface layer 14. In the experiments reported here, best results were obtained with a silicon-oxide buffer (SiO or $SiO_2$) but other insulating materials including other oxides work also. The buffer layer 16 is not required for generating light but is used as part of the diode structure to allow contacts to be provided and to form patterns of light generating areas as shown for example in FIGS. 2A, 2B, 3A and 3B. To produce the patterns, holes 17, 37 (FIGS. 3A, 3B) in the buffer layers 16, 36 are produced by standard lithographic methods (lift-off, in one embodiment), but other methods could be used. As shown in FIG. 1A, the sidewalls of the holes 17 may be sloped, which facilitates making of the device, but is not necessary.

A conductive layer 18 is provided on the surface layer 14 for example by a deposition method. The conductive layer 18 is formed directly on top of the surface layer 14 in regions of light generation, but is formed on the buffer layer 16 in other areas. The conductive layer 18 is electrically conductive and at least sufficiently transparent to allow electromagnetic radiation generated by the diode 10 to pass through the conductive layer 18. In the embodiment shown, the conductive layer is formed from layers 19 and 20, where layer 19 is a thin Titanium (~3-5 nm) layer used for adhesion and layer 20 is a gold (~20-30 nm) top layer that also functions as part of a contact. Different thicknesses would also work. The thinner, the more radiation passes through, but thinner means more fragile. This is not the optimal contact for light extraction but is easy to use as a proof of principle. Other metals such as Aluminum or transparent oxide contacts such as indium-titanium oxide could be used. Operational characteristics will depend on the relative Fermi levels of the wafer 12 and conductive layer 18, so that for example if the Fermi level of the wafer 12 is sufficiently separated from the Fermi level of the conductive layer 18, only one colour emission may be obtained at low voltages. Contacts are provided on the semiconductor wafer 12 and conductive layer 18 for connection to a power source. Portions of the conductive layer 20 and a layer 22, such as aluminum, on the back of the semiconductor wafer 12 may be used as part of the contacts, which may also include suitable elements 26 to facilitate connection to a wire 24 of a power circuit 28.

The back contact layer 22 may be made with aluminum or other suitable material. Aluminum may be annealed at temperatures of 400° C. to provide a good Ohmic contact, but the devices work without annealing as well. The semiconductor wafer 12 may also be made of n-type silicon, with the appropriate choice of contacts and opposite current direction. In this way, the emitting region is defined by the area where the conductive layer 18 touches the surface layer 14. Current should flow in this region only. Areas where the conductive layer 18 touches the buffer 16 resist current flow, are inactive and should be the non-emissive parts of the device. The emitted light penetrates the conductive layer 18.

Figure 2A:
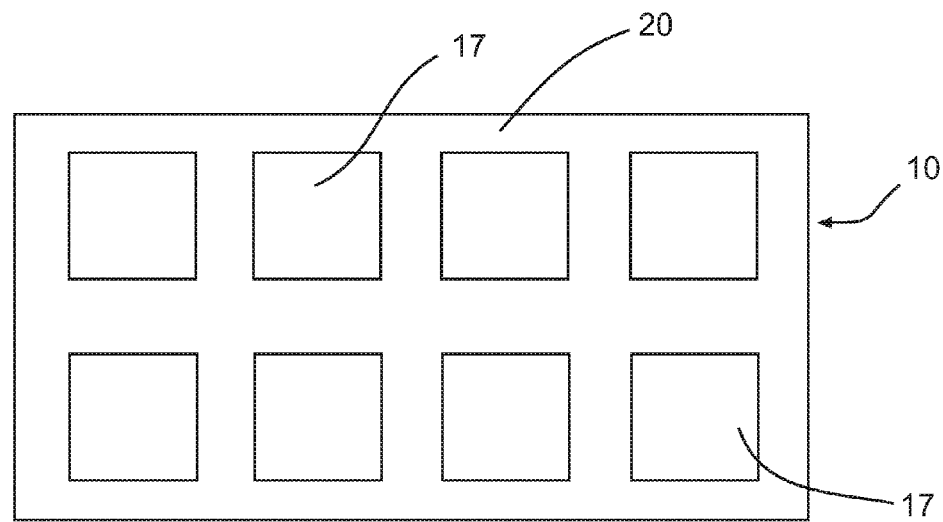
FIGS. 2A and 2B show respectively top views of an array of square emitters and an array of concentric rings is shown in reverse bias.
Figure 2B:
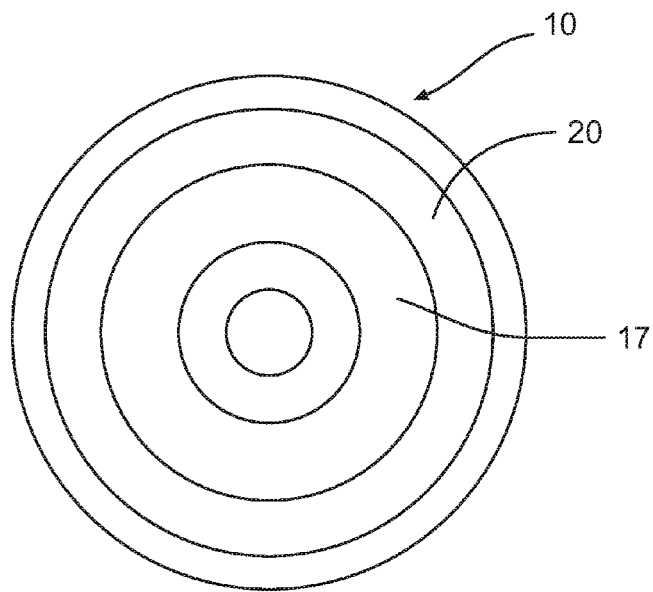

In this way, any pattern can be readily created, such as the array of square holes 17 shown in FIG. 2A. Because the top contact 18 is sufficiently continuous along the sidewalls of the holes defined in the buffer layer 16 if the top oxide is thin, there is not necessarily any need to make individual contacts to each of the emitting regions. For example, a structure of concentric annular holes 17 is shown in FIG. 2B, in which the contact 18 simultaneously works on all of the well-separated emitting regions.

Figure 3A:
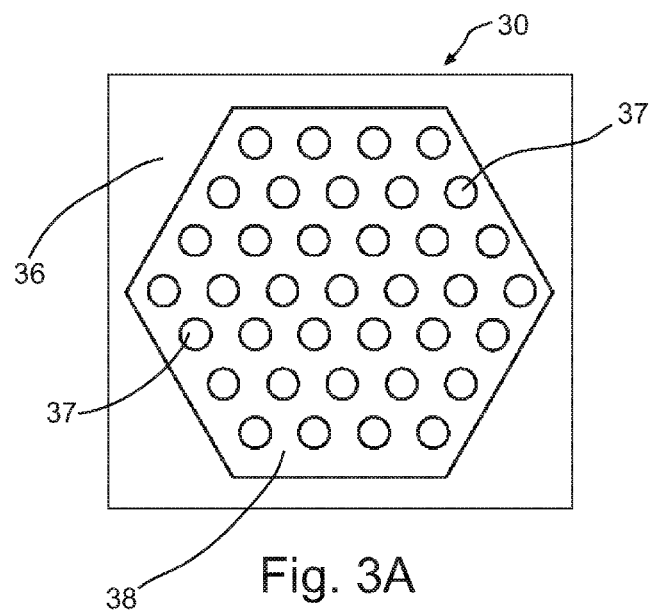
FIGS. 3A and 3B show respectively a top view and cross-section of a photonic crystal design (left: top view, right: cross section), in which native oxide and Ti layers are not shown, and in which the emitting regions will be in the silicon wafer below the gold contacts to prevent light from traveling in the silicon wafer parallel to the LED-air interface.
Figure 3B:
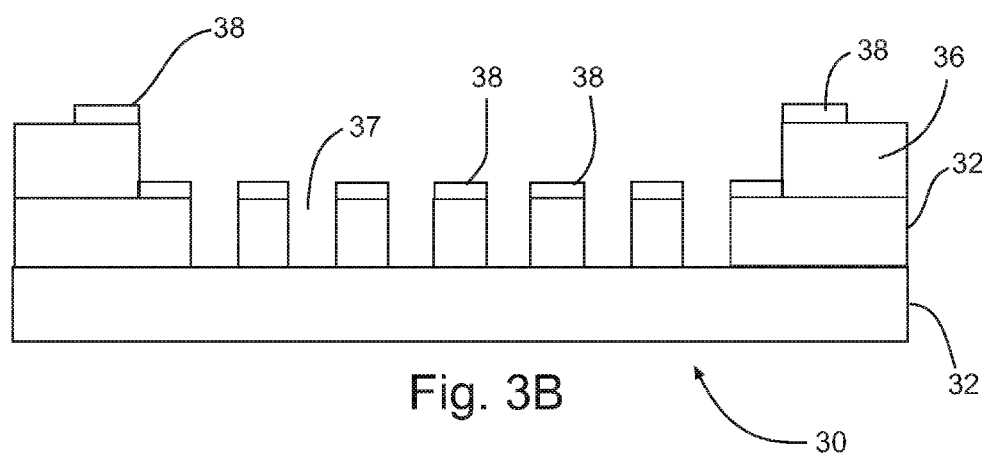

Referring to FIGS. 3A and 3B, a light emitting diode 30 is shown that forms a photonic crystal emitter. The diode 30 is formed on a semiconductor material 32, which may have an indirect bandgap, for example silicon as in FIG. 1, and has a surface layer (not shown, but as in FIG. 1) and is capped by a conductive layer 38 (such as gold and titanium as in FIG. 1). A buffer layer 36, for example $SiO_x$, surrounds the light emitting region. By creating a pattern of holes 37 in the semiconductor wafer 32 with an appropriate optical bandgap and forming the layer 38 as described above, it will be possible to preferentially forward-direct the light emission. If the holes 37 in the semiconductor wafer 32 are deep, then the emitting regions will only be on top. The emitting region can either be below the photonic crystal structure as in previous work on silicon nanocrystals (C. D. Presti, A. Irrera, G. Franzo, I. Crupi, F. Priolo, and F. Iacona, Appl. Phys. Lett. 88, 033501 (2006)) or, more efficiently, the photonic crystal structure can itself be the emitter. The incorporation of a back minor (e.g., by deposition of a metal surface or a dielectric multilayer) in a region sufficiently far back not to disturb the emitting region but close enough to minimize absorption could further enhance the light extraction efficiency. Surface roughening could also be done to minimize internal reflection.

Figure 4:
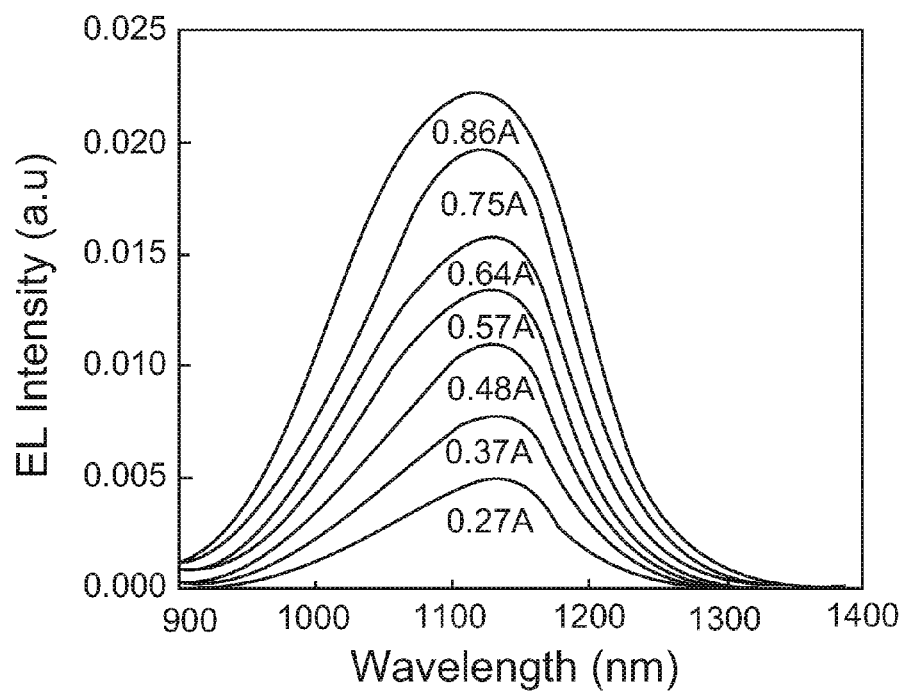
FIG. 4 is a graph showing b Band edge emission centered at 1100 nm (infrared) with different currents through an embodiment of a LED with a device size of ~25 mm².
Figure 5:
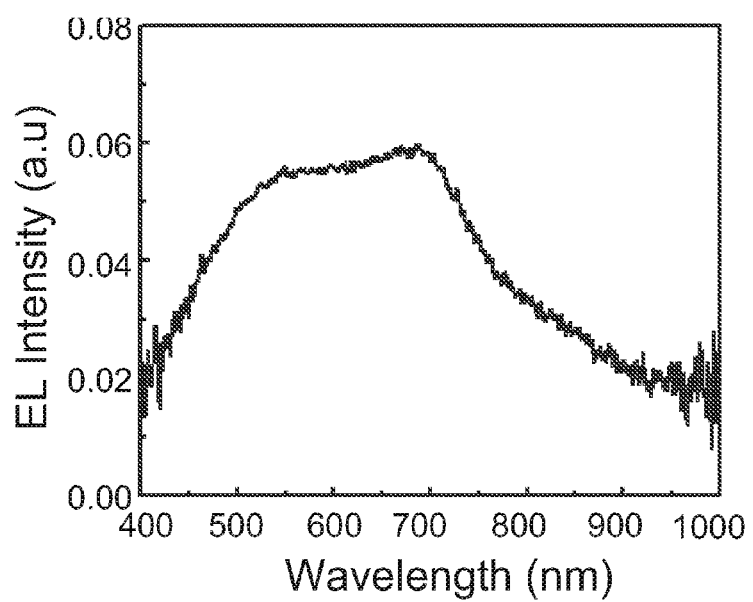
FIG. 5 is a graph showing typical visible-range electroluminescence spectrum under reverse bias.
Figure 6:
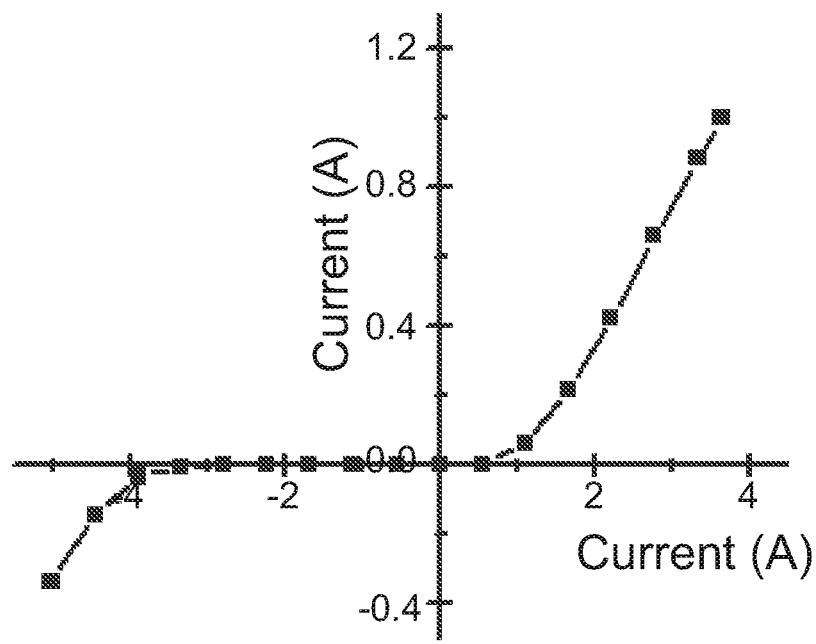
FIG. 6 is a graph showing I-V curve showing the strong rectifying behavior of an embodiment of the diode.
Figure 7:
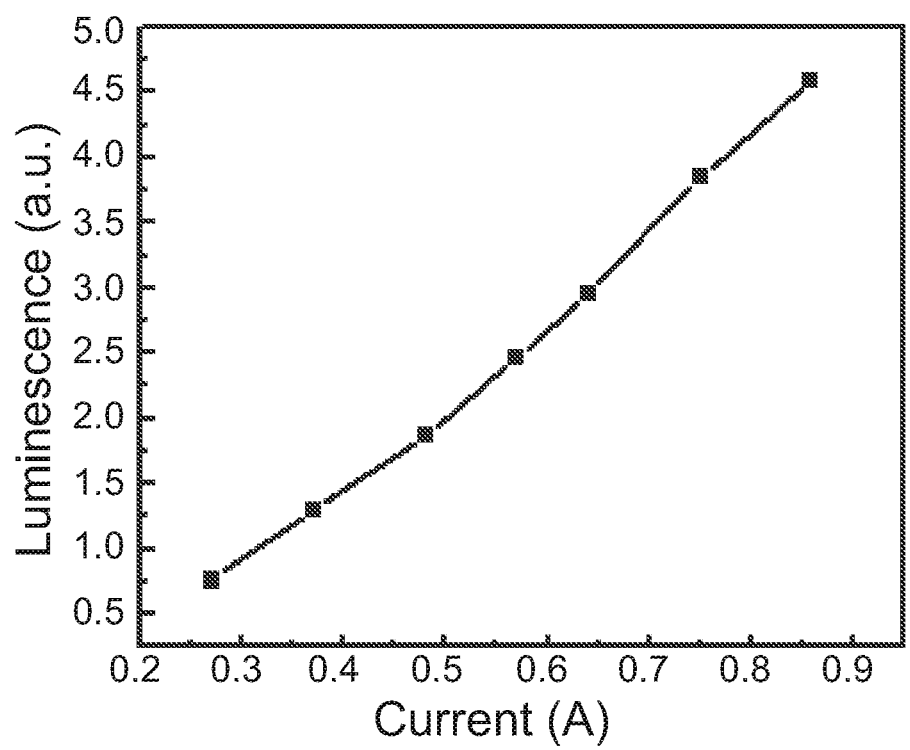
FIG. 7 is a graph showing band edge luminescence intensity (integrated) vs. current through an embodiment of the diode.

Emission spectra from exemplary LEDs made in accordance with the embodiment of FIG. 1 are shown in forward and reverse bias in FIGS. 4 and 5. In this instance, the semiconductor wafer was p-doped silicon, the surface layer was native oxide less than 3 nm thick, and the conductive layer was titanium and gold. We see that in forward bias (i.e., electron injection from the metal contact in the case of a p-type substrate) there is an infrared emission band centered near 1100 nm that is characteristic of band-edge recombination in silicon. The turn-on voltage is close to 1 V. Because of the low resistivity of these devices, even quite low voltages produced a high total current through the active region. In reverse bias, on the other hand, a broad visible emission appears (orange-white to the eye), which is weaker than the band edge emission. The turn on voltage in this case was about 4 V, as the devices tend to show good rectification (FIG. 6). This visible emission appears to be due to recombination in the native oxide layer and to avalanche breakdown in the semiconductor. No saturation of the EL intensity was observed (FIG. 7) up to the source meter test current limit of 1 A. Lower-doped wafers were also tested with similar EL results, although the voltages required for a given luminescence intensity were higher.

Figure 8A:
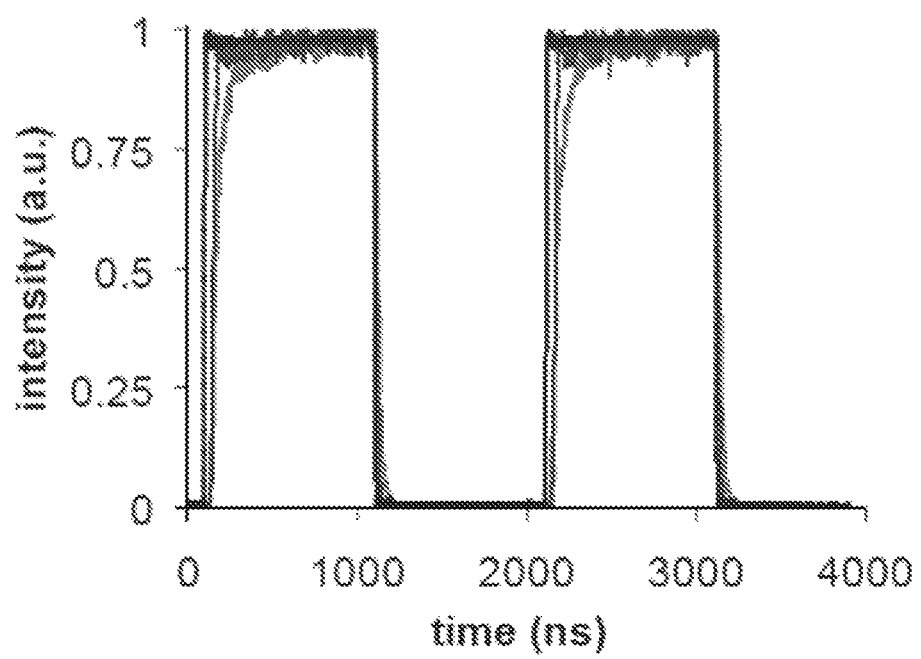
FIG. 8A shows normalized square-pulse response of visible and infrared emission.
Figure 8B:
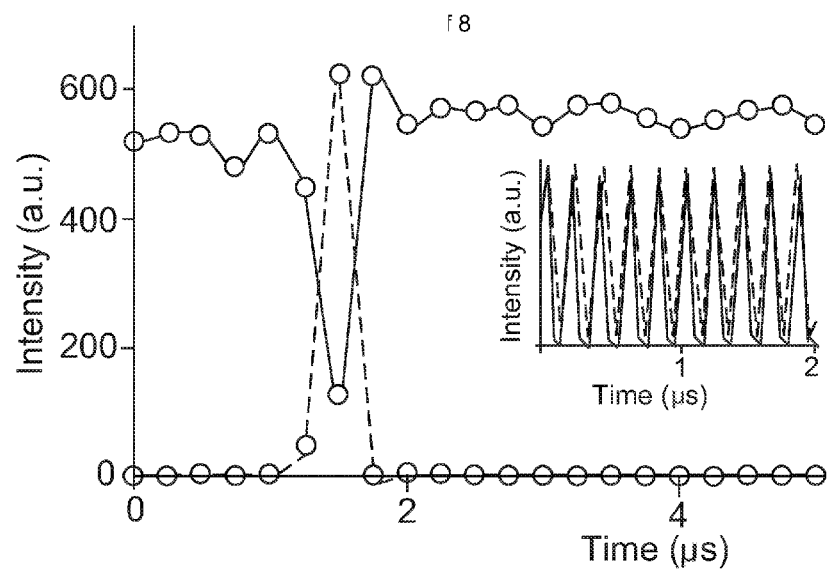
FIG. 8B illustrates color-color switching on a single device in which a bias tee kept the device reverse biased, with a pulse generator producing positive pulses on top, in which the inset shows 5 MHz on-off switching for both colors.
Figure 8C:
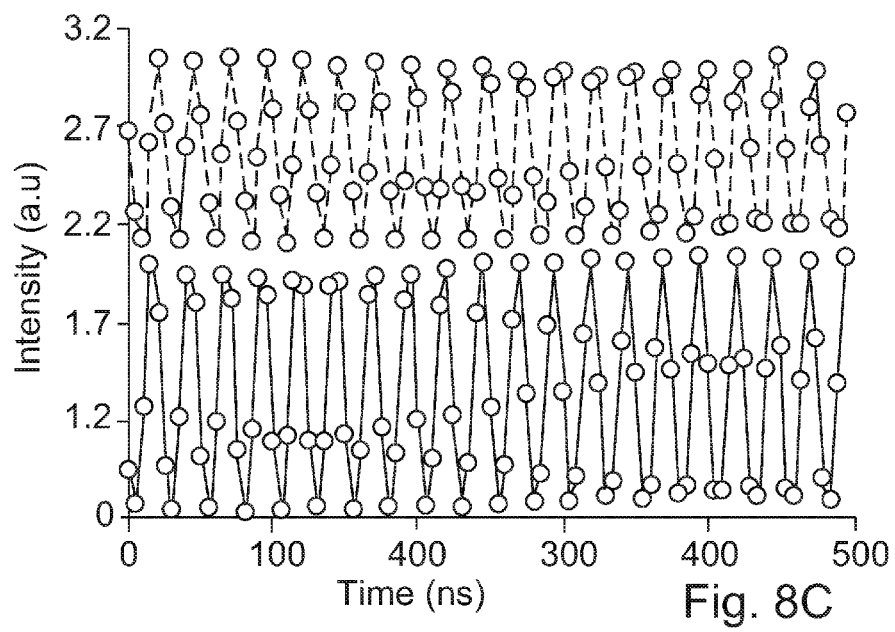
FIG. 8C shows 40 MHz high-low switching for both the visible and IR emission bands, in which the IR data was offset upwards for clarity.

The decay dynamics of the EL in forward and reverse modes are shown in FIGS. 8A-8C. The decays are rapid by the standards of bulk silicon. We can define a characteristic time as the time required to decay to $1/e=0.37$ of the initial intensity. In this way, the lifetimes are on the order of a fraction of a microsecond. By applying a bias offset, we expect that the lifetimes can be shortened (e.g., by having a reverse bias baseline in the case of the band-edge emission). Therefore, by biasing tunnel diodes with a negative baseline, we expect to be able to modulate the LEDs at a frequency of at least 1 MHz, but hundreds of MHz or more could be achievable under the right conditions. One example of the switching potential of is shown in FIG. 8B, where we see a rapid voltage spike causing a fast (250-ns resolution-limited) switching of the emission from visible to infrared.

The internal quantum efficiency (QE) of these LEDs are presently low, roughly a small fraction of a percent, typical of silicon LEDs without any enhancement of the light extraction efficiency. The values we measure are lower than the claimed external QE for some p-n junction diodes (Trupke, J. Zhao, A. Wang, et al., Appl. Phys. Lett. 82, 2996 (2003) but, as discussed below under additional embodiments, there are several ways that the external QE from the present structures can be increased, including: i) using more transparent electrodes instead of titanium+gold such as indium-titanium oxide, ii) roughening the surface to reduce the large fraction (as much as 96%) of light undergoing internal reflection at the Si interface, iii) patterning the top surface into a photonic crystal structure with a bandgap appropriate to prevent light from traveling horizontally in the emitting layer, iv) using a back reflector mirror, and v) decreasing the non-radiative defect concentration in the silicon (our wafers were standard commercial materials without any special processing). Finally, we note that, in the present devices, the current density (i.e., device area for a given total current) may be adjusted for optimum efficiency.

The nature of the buffer film may play a minor role in the behavior of the devices. In the absence of a good insulator (e.g., a thin oxide film with defect pathways), some of the current will "leak though" the film and reduce the overall device efficiency. In this case, the best results were obtained for a silicon oxide buffer. We tested alumina buffers and found generally similar emission properties. Other insulating films should, in principle, work as well.

One attraction of the light emitting device is the possibility of two color emission depending on the current direction. This emission is switchable on at least a sub-microsecond timescale, which is the fastest we can measure. One group has recently shown two color (red and blue) emission from rare-earth-doped oxide films on silicon as a function of the current density (S. Prucnal, J. M. Sun, W. Skorupa, and M. Helm, Appl. Phys. Lett. 90, 181 121 (2007). Two color band-edge-IR and visible (or another wavelength) may be obtained by using very thin, lightly doped oxide films instead of a native oxide on the device surface, or by doping the semiconductor wafer (e.g., with erbium), or by using a different semiconductor. In this way, tunnel diodes should be obtainable showing two color pairs with other emission wavelengths.

When operated in the accumulation mode, MIS devices trap the majority carriers within a few nanometers of the semiconductor-oxide interface. Therefore, if recombination occurs within the accumulation region of a forward-biased MIS device, the desirable effects imposed by geometrical confinement should minimize the SRH recombination probability. Theoretical investigations show that the minority carrier tunneling of electrons from the metal into the silicon valence band (for a p-type semiconductor) dominates the net tunneling current in a MIS diode, exactly as needed for radiative recombination to occur in the accumulation region of a forward-biased structure. However, for ultra-thin gate oxides, the majority carrier current (which does not produce light) can become significant as well. This part of the current can be used in principle to control the switching time of the device.

There are several key parameters in designing the MIS LED. First, the gate oxide needs to be thin, less than 3 nm. In some samples we employed the ~1-nm-thick native oxide (nOx), and in others we removed the nOx and used a 1 nm evaporated and annealed $SiO_2$ layer. In some embodiments, the device also should be small, in order to minimize the RC delay time. Also important for efficient operation is the selection of the top contact material. Metals with a small work function cause the diode to be well into depletion in the absence of applied bias (for a $p^+$ Si substrate). This would require unnecessary additional voltage to achieve the light-emitting accumulation state. The Fermi level for the heavily-doped substrates used in some embodiments lies ~0.05 eV below the valence band and aligns closely with the Fermi level of the Au contact. Therefore, only small voltages are required to switch from the accumulation to depletion mode. The presence of the ultra-thin Ti adhesion layer was found to have little effect on the electrical properties but greatly increased the durability of the devices.

For an embodiment made in accordance with the example of FIG. 1, the I-V curve showed the good rectifying behavior expected of a MIS diode. In forward bias the irradiance increases with current until device breakdown at about 5-6 V, showing no sign of saturation. Under these conditions, hole accumulation occurs in the near-surface region of the p-type silicon and minority carriers (electrons) tunnel through the ultra-thin oxide to recombine in the accumulation region. The external power efficiency (optical power emitted divided by electrical power supplied) was $\sim 10^{-6}$, which is comparable to other MIS diode devices although lower than the reported values for silicon pn diodes. Non-radiative Auger processes generally result in the saturation of the EL intensity with increasing current; the lack of this effect implies that the Auger mechanism is less probable than radiative recombination in MIS LEDs of this type.

Under reverse bias, the visible emission intensity showed a roughly similar increasing trend as a function of current. In this case, the EL can be attributed to avalanche breakdown in the silicon. This interpretation is consistent with the fact that emission occurred and became strong for voltages above reverse breakdown on the I-V curve. The orange emission is expected under breakdown conditions on the basis of inter- or intra-band hot carrier recombination in the plasma region. Despite the lower efficiency, silicon "avalanche emitters" have potential applications in electro-optical interfacing, coupling, and amplification devices.

The rise and decay times under forward bias were close to but slightly longer than the nominal 10 ns response time of the pulse generator (FIG. 8A). Similar fast speeds were observed in reverse bias. The characteristic decay time was almost 4 orders of magnitude shorter than that observed for PL in the same devices, where the lifetime followed a stretched exponential decay $I_t/I_0=\exp[-(t/\tau)^\beta]$ with $\tau=55$ µs and $\beta=0.8$. The response time of the LEDs was largely independent of the pulse conditions (frequency and pulse height), which is consistent with a MIS diode operating in accumulation. FIG. 8B shows the switching from visible to infrared emission; the switching speed is limited to a single 250-ns data point achievable with the collection system used for that measurement. A high-low switching for both the IR and visible operation is demonstrated at 40 MHz in FIG. 8C. At this high speed in this embodiment, the device never gets to totally off but instead switches from bright to less bright. The intercept on the y axis is not at zero in the inset of FIG. 8B. The data offset is due to the combined effects of the luminescence decay time and the pulse generator response time. Calculations incorporating the pulse generator response and the observed rise and decay times suggest that switching speeds on the order of 100 MHz (outside the range of our setup) are possible, although with a large offset in the present circuit geometry.

The device speed is not related to the band-to-band recombination lifetime, which in other MIS diodes is a few tens of microseconds. It is weakly affected by the RC time constant, as verified by inserting additional resistors into the diode circuit. The much higher frequencies of these LEDs compared to those previously reported in single-color devices implies that a mechanism is operative which is not present in MIS-based LEDs with thicker oxides. The main difference for an extremely thin barrier (less than 3 nm) is that there is a non-negligible majority carrier current (eg holes tunneling into the metal). This current can rapidly discharge the small lithographically defined MIS capacitor without electron-hole recombination in the semiconductor. Concerning the reverse bias visible emission, the rapid device speed is consistent with the properties of avalanche breakdown emitters.

There are several advantages of this approach to the fabrication of silicon LEDs. The MIS-LED color switching design is compatible with CMOS processing. Furthermore, the normally slow recombination time of silicon-based LEDs can be sidestepped. On-off and color-color switching was achieved at high frequencies, and by using thinner oxides or a more complex circuit faster switching should be possible. Bandgap engineering using different impurities or dopants (including erbium) are soundly predicted to extend the wavelength range over which the MIS diode will operate. In a device with multiple emission regions, all the emission regions may be addressed simultaneously or independently. Despite the overall high drive power presently required, such devices could relatively easily be scaled down to transistor size (e.g., $10^4$ nm$^2$), needing currents as low as 0.1 µA per LED in order to maintain the same net irradiance. In addition, the fabrication method permits the formation of photonic crystal or Fresnel zone-plate emitters and does not require high processing temperatures. However, certain limitations do remain. IR operation at 1.5 µm would be preferable, and soundly predicted to be achievable via Er-doping. The external efficiency of the band edge emission was on the order of $10^{-6}$, due—in part— to the limited optical penetration through the metal top contacts as calculated using matrix optics and the small angle for total internal reflection. It is also due to the majority carrier fraction of the total current. Improvements to the efficiency will make use of surface roughening or photonic crystal structures, transparent top contacts, and can employ the same silicon quality enhancements that have so greatly increased the efficiency of pn junction devices.

We tested the oxide effects by removing the nOx in HF and subsequently evaporating an SiO$_2$ film from 1 to 4 nm thick on the clean Si surface (wafers were exposed to air for about one hour between nOx removal and PVD-oxide deposition). The embodiment tested was otherwise built in accordance with the exemplary features shown in the embodiment of FIG. 1. The results (FIG. 9) show that the emission intensity is dependent on the oxide thickness, in the present case peaking for about 1 nm of deposited SiO$_2$ (the real thickness may be up to 30% greater than indicated by the thickness monitors in the system geometry used). A zero-oxide-thickness LED was also tested, giving a very weak emission (weaker than the 2 nm oxide in FIG. 9) presumably due to the thin nOx that had developed between HF etching and device testing.

Figure 9:
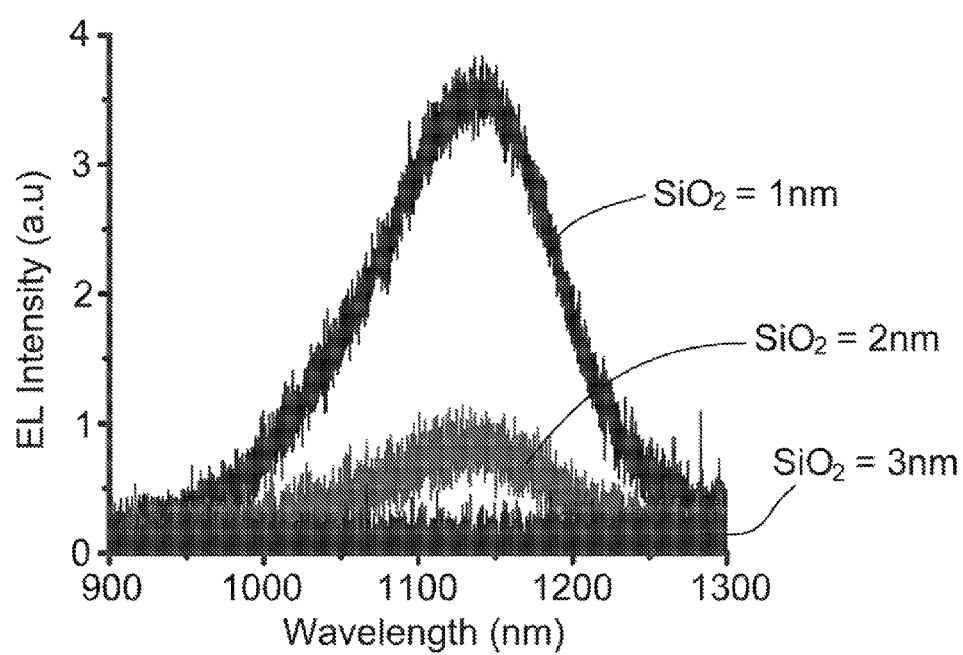
FIG. 9 shows EL spectra with 2 V forward bias for different oxide thicknesses.

The I-V curves for the devices used to generate FIG. 9 generally indicated good rectifying behavior in the brightest devices, with breakdown occurring at about 3 V in reverse bias. The spectrum of the IR emission became wider as the doping levels increased, consistent with calculations of the Fermi energy (which is within the valence band for degenerately doped p$^+$-type Si). Finally, we also investigated the effect of the Ti adhesion layer. The band structure in the embodiment of FIG. 1 does not include the effect of the ultra-thin Ti layer used for bonding of the top contact. In fact, although gold contacts routinely require adhesion layers, their electrical effect is rarely reported in the literature. In repeated experiments, we found that the Ti layer is needed for most reliable operation with gold contacts. Devices with Au-only top contacts, although functional, tended to be poorer emitters with lower quality contacts that were visibly detached from the specimen surface in some places. However, too much Ti (more than approximately 5 nm) decreased the emission intensity more than expected on the basis of transfer matrix calculations for the net transparency, consistent with its smaller work function compared to Au. In fact, for an optimal adhesion layer thickness of ~3 nm, the devices behaved similarly to what would be expected on the basis of FIG. 1. Therefore, extremely thin Ti layers used to bond the Au contact to the silicon appear to have little fundamental effect on the electrical properties of the device but strongly enhance the quality of the top Au contact and therefore the properties of the device as a whole.

In our case, the color switching is a result of the selection of the electrical properties (i.e., the Fermi levels) of the silicon and the contact materials, in combination with the required drive voltages. The fast switching is achievable in MIS capacitor-type diodes because switching is not related to intrinsic carrier recombination times but to discharge through the circuit (probably by majority carrier tunneling through the thin oxide into the top contact).

The great ease of synthesis and patterning of these devices will enable surface patterning into special structures such as photonic crystals and gratings. These devices may be used with surface structures on silicon, including photonic crystals, optical waveguides, and Bragg gratings. By building these devices on SOI material, one may expect to obtain a dielectric boundary that would reflect at least part of the backward propagating light. The diodes 10 may also incorporate back mirrors, as for example by providing the contact 22 with a reflective coating, or other light-enhancement devices.

Some embodiments of the light emitting diode 10 provide room temperature EL from silicon devices made with a simple CMOS-compatible technique that requires no high temperature treatments, nor any special fabrication procedures other than the deposition of an oxide film, patterning of the oxide film, and assembly of the contacts. Some embodiments of the light emitting diode 10 also provide color switching including infrared luminescence under forward bias conditions, and visible luminescence under reverse bias conditions; and switching lifetimes that are on the order of microseconds to sub-microseconds. Embodiments of the diodes 10 could therefore be incorporated at any stage of CMOS post-processing. It is an additional object of some embodiments of the light emitting diode 10 to demonstrate patterning of the LED emitter regions into predefined regions, and to show that this patterning technique could be applied to emission enhancement methods such as photonic crystal surfaces. Another embodiment would incorporate this LED directly on a semiconductor waveguide, forming a device that serves as the light emitter and waveguide. Light-extraction enhancement may also be provided in some embodiments, including roughened or patterned surfaces, photonic crystals, back reflector mirrors, or any other means to increase the external quantum efficiency of these devices.

Immaterial modifications may be made to the embodiments described here without departing from what is covered by the claims. In the claims, the word "comprising" is used in its inclusive sense and does not exclude other elements being present. The indefinite article "a" before a claim feature does not exclude more than one of the feature being present. Each one of the individual features described here may be used in one or more embodiments and is not, by virtue only of being described here, to be construed as essential to all embodiments as defined by the claims.

What is claimed is:

1. A method of operating a light emitting diode, comprising:
   providing a semiconductor wafer with a surface layer that is sufficiently electrically insulating to allow quantum tunneling of charge carriers through the surface layer, the surface layer having a thickness of 3 nm or less, and having a conductive layer on the surface layer, the conductive layer being electrically conductive and at least sufficiently transparent to allow electromagnetic radiation to pass through the conductive layer, in which the Fermi levels of the semiconductor wafer and the conductive layer are selected so that pulsed electrical bias across the surface layer changes the operation of the light emitting diode from accumulation to depletion mode; and
   applying a pulsed bias through contacts on the semiconductor wafer and conductive layer across the surface layer to cause the operation of the light emitting diode to switch between operational modes including accumulation and depletion modes and cause the light emitting diode to emit different wavelengths of electromagnetic radiation.

2. The method of claim 1 in which the semiconductor wafer comprises a semiconductor having an indirect bandgap.

3. The method of claim 2 in which the semiconductor wafer comprises silicon.

4. The method of claim 3 in which the surface layer comprises silicon dioxide.

5. The method of claim 1 in which the conductive layer comprises a material transparent to visible light.

6. The method of claim 1 in which the thickness of the surface layer is less than 2 nm.

7. The method of claim 1 in which the operational modes further include an off mode.

* * * * *